United States Patent [19]
Dartois et al.

[11] Patent Number: 4,792,914
[45] Date of Patent: Dec. 20, 1988

[54] HIGH FREQUENCY DIGITAL SYNTHESIZER WITH APERIODIC CORRECTION OPTIMIZING THE SPECTRAL PURITY

[75] Inventors: Luc Dartois, Colombes; André Roullet, Domont; Raymond Riboni, Montesson, all of France

[73] Assignee: Thomson-CSF, Paris, France

[21] Appl. No.: 943,993

[22] Filed: Dec. 22, 1986

[30] Foreign Application Priority Data

Dec. 23, 1985 [FR] France .................. 85 19067

[51] Int. Cl.⁴ .............................. H03K 3/78
[52] U.S. Cl. .......................... 364/607; 320/14
[58] Field of Search ........... 364/607, 701, 720; 331/25, 14; 375/120; 328/14, 186, 159

[56] References Cited

U.S. PATENT DOCUMENTS

| | | | |
|---|---|---|---|
| 4,144,579 | 3/1979 | Nossen et al. | 364/607 |
| 4,185,247 | 1/1980 | Harrison | 328/165 |
| 4,240,034 | 12/1980 | Lowenschuss | 328/14 |
| 4,374,438 | 2/1983 | Crowley | 375/120 |
| 4,410,954 | 10/1983 | Wheatley | 328/14 |
| 4,563,657 | 1/1986 | Qureshi | 375/120 |

FOREIGN PATENT DOCUMENTS

0147307  3/1985  European Pat. Off.
2431800  2/1980  France.

Primary Examiner—Michael R. Fleming
Attorney, Agent, or Firm—Oblon, Fisher, Spivak, McClelland & Maier

[57] ABSTRACT

A high frequency digital synthesizer is provided with aperiodic correction optimizing the spectral plurity, including:

a generator of reference clock signals of frequency $F_C$, a computing device, which, from a frequency increment of the signal to be synthesized, delivers, on the one hand, uncorrected pulses of frequency $F_{Sj}$ shifted in the time with respect to the signal of frequency $F_S$ to be synthesized by an amount $\Delta t$ at most equal to $1/F$ and, on the other hand, a time error signal corresponding to the shift $\Delta t$ and a correction circuit which is initiated by each of the frequency pulses $F_{Sj}$ for delaying the signal $F_{Sj}$ by a maximum time when the time error signal is zero by an amount equal to the maximum time reduced by the shift $\Delta t$ indicated by the time error signal.

7 Claims, 5 Drawing Sheets

FIG_2

FIG_5

FIG_6

HIGH FREQUENCY DIGITAL SYNTHESIZER WITH APERIODIC CORRECTION OPTIMIZING THE SPECTRAL PURITY

BACKGROUND OF THE INVENTION

1. Field of the Invention

The present invention relates to a high frequency digital synthesizer with aperiodic correction optimizing the spectral purity.

It applies essentially to the construction of frequency shift transmitters-receivers, modulators-demodulators for digital transmission systems as well as the construction of radiography systems using nuclear magnetic resonance. In these applications, synthesis of the clock signals is obtained by means of frequency synthesizers having very brief frequency acquisition times and very good frequency resolutions. Only the frequency synthesizers using direct synthesis methods allow such results to be obtained.

As counterpart to the high speeds obtained by the direct digital synthesis method, the clock signals delivered by the corresponding frequency synthesizers have reduced spectral purity because of the presence of parasite spectral lines of energy −50 to −60 dBc and high noise. In addition, the frequency synthesizers using this method have a relatively low maximum operating frequency of the order of a few megahertz. Now, for numerous applications, these performances appear distinctly insufficient and do not in particular allow the problems of proximity in radiotelecommunications to be solved. Furthermore, in order to keep a high synthesis speed in high frequencies (HF, VHF, UHF) the addition and recopying loops must have wide bands and are for this reason inefficient as filters. Since any synthesized frequency leads to a spectrum of parasite spectral lines, the frequency synthesizers using direct synthesis methods are provided with devices for attenuating both the noise and the amplitude of the parasite spectral lines.

2. Description of the Prior Art

A device of this type is described for example in the U.S. Pat. No. 4,185,247. The direct frequency synthesizer which is described therein includes an accumulator driven by a clock frequency which is as high as possible with respect to the frequency to be synthesized. This latter is provided by the pseudo periodic overflow of the accumulator. Such pseudo-periodicity gives a parasite phase modulation which is known and which is formed by the residue of the accumulator expressed as a fraction of the synthesized clock. This, using a digital-analog converter, allows a reverse modulation of the parasite modulation to be provided and so the parasite spectral lines to be reduced. These results are obtained with a phase correction system which is formed either from a tuned phase shift, containing variable capacity diodes known under the name of "varicaps" or from high speed loops containing a voltage controlled oscillator into the loop of which the correction modulation is injected. These phase correction systems have as drawbacks the fact of having poor linearity, of not being a periodic and of not being climatically stable and, furthermore, they do not allow frequencies to be synthesized beyond the octave with a linearity less than 1. From the plan of the construction described in the above U.S. patent, the maximum synthesizable frequency seems to be half that of the digital-analog converter used for providing the correction. Furthermore, the adders, counters and accumulators used are such that their speed decreases when their size increases, that is to say when the resolution or the synthesis pitch becomes finer and finer.

In other variants of construction described, for example in the patent GB No. 2 026 268 or else in the French patent No. 2 431 800, the level of the residual uncorrected spectral lines is attenuated by modulating the phase increment of the accumulator on the digits not corrected by the digital-analog converter. But this attenuation is provided to the detriment of the noise and in any case the same modulation power (spectral line noise) is to be found at the output of these devices.

SUMMARY OF THE INVENTION

The aim of the invention is to overcome the above mentioned drawbacks.

For this, the invention provides a high frequency digital synthesizer, with a periodic correction optimizing the spectral purity, comprising:

a generator of reference clock signals of frequency $F_C$, computing device which, from a frequency increment of the signal to be synthesized, delivers on the one hand uncorrected frequency pulses $F_{Sj}$ shifted in time with respect to the frequency signal $F_S$ to be synthesized by an amount $\Delta t$ at most equal to $1/F_c$ and, on the other hand, a time error signal corresponding to the shift $\Delta t$ and a correction circuit which is initiated by each of the frequency pulses $F_{Sj}$ for delaying the signal $FS_j$ by a maximum time when the time error signal is zero and by an amount equal to the maximum time reduced by the shift $\Delta t$ indicated by the time error signal.

The advantages of the synthesizer of the invention are that a high spectral purity can be obtained and automatic matching of the part of the residue to be supplied to the time deviation correction circuit as a function of the synthesized frequency. Furthermore, the architecture of the circuit is readily integrable in the form of an integrated component and the time deviation correction circuit which is of the pulse delay type ensures very good linearity, good climatic stability and total aperiodicity.

The synthesis method used allows frequencies to be synthesized going from the pitch of the synthesizer up to that of the digital-analog converter and so allows an octave to be gained with respect to the performances of known circuits while covering the whole of this operating range with the same time deviation correction circuit.

BRIEF DESCRIPTION OF THE DRAWINGS

Other features and advantages of the invention will be clear from the following description with reference to the accompanying figures which show.

DESCRIPTION OF THE PREFERRED EMBODIMENTS

Figure 1:
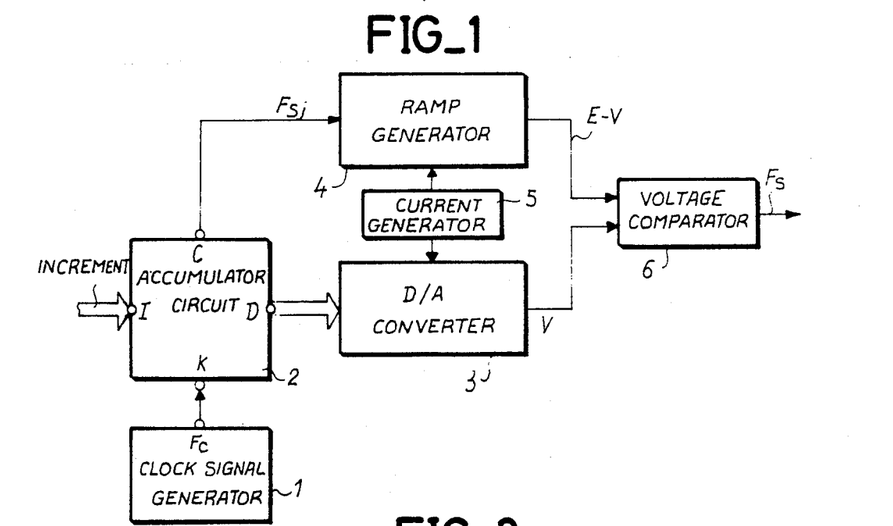
FIG. 1: a block diagram of the direct frequency synthesizer of the invention.

The synthesizer of the invention which is shown in the general diagram of FIG. 1 includes a generator 1 of a clock signal of fixed frequency $F_C$, an accumulator circuit 2, a digital-analog converter 3, a ramp generator 4, a reference current generator 5 and a comparison circuit 6. The fixed frequency generator 1 is connected to the clock input marked k of the accumulator circuit 2. The accumulator circuit 2 includes an input I to which is applied a phase increment for increasing the contents of the acumulator register at each clock pulse delivered by generator 1. The accumulator circuit 2 also includes an overflow output C which delivers a pulsed $F_{Sj}$ representing the uncorrected synthesized frequency whenever the accumulator register reaches its maximum capacity and an output D for applying the contents of the accumulator circuit to the input of the digital-analog converter 3.

The overflow output C of the accumulator circuit is connected to an input of the ramp generator 4 which delivers a saw tooth signal whenever a pulse appears at the overflow output C of the accumulator circuit 2. The digital-analog converter 3 and the ramp generator 4 are supplied with power by a reference current generator 5. The outputs of the D-A converter 3 and of the ramp generator 4 are connected respectively to a first and a second comparison input of the voltage comparator 6 which delivers at its output the synthesized clock signal.

Figure 2:
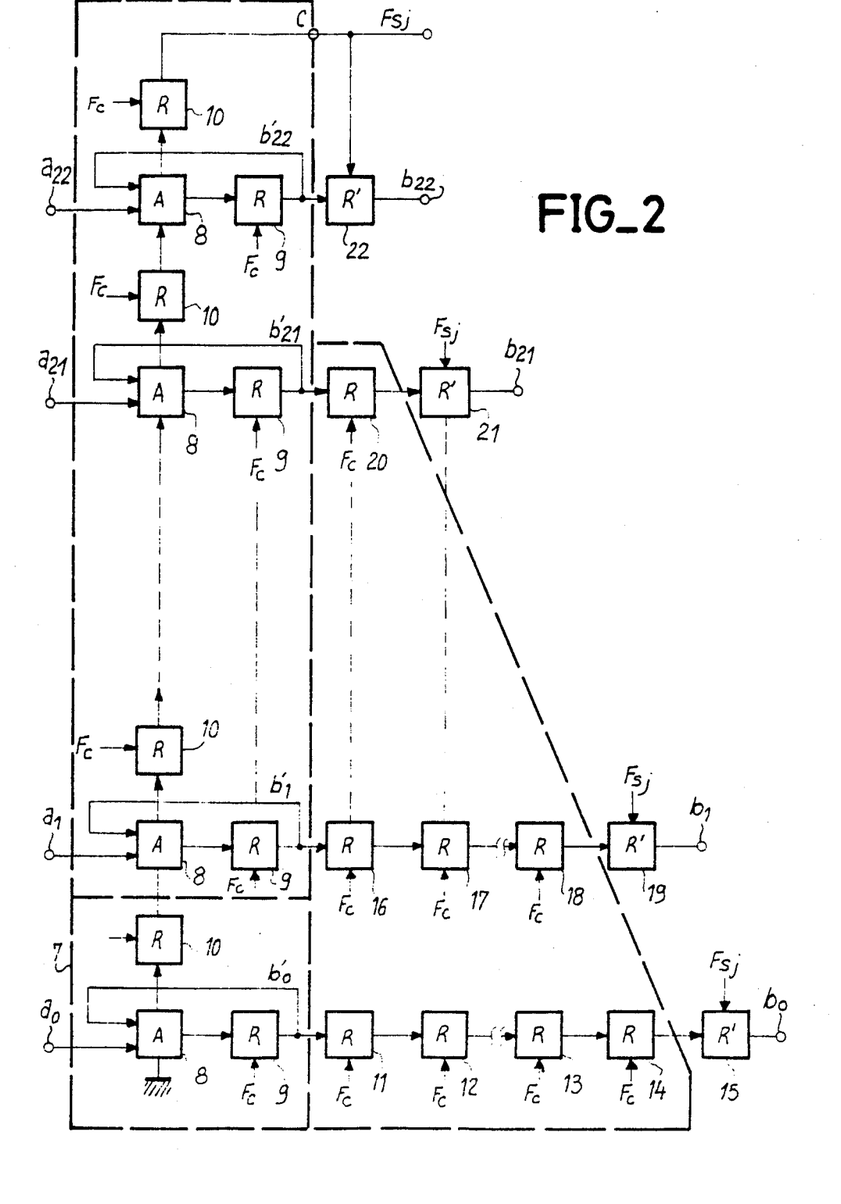
FIG. 2: the details of construction and the basic principle of a high speed phase accumulator circuit used for implementing the invention.

One embodiment of the accumulator circuit 2 is shown in FIG. 2. This embodiment increases the speed of the accumulator circuit 2, in the technology in which it is formed and maximizes the ratio of the clock frequency $F_C$ to the maximum synthesis frequency $F_S$ which reduces the parasite modulation level at the overflow output C and allows the synthesis of higher frequencies. The accumulator circuit shown is formed by a given number of elementary 1 bit accumulators, of the type shown at 7 inside a broken line in FIG. 2, including an adder circuit 8, a one bit register 9 connected directly to the output of adder 8 and a carry register 10 connected directly to the carry output of the adder circuit 8. In the Figure, the increment bit $a_o$ applied to a first input of adder 8 is added to the contents of register 9 which is applied at the timing of frequency $F_C$ to the second operand input of adder 8. The carry over, if it exists, is propagated inside register 10. The results of the additions and possible carry overs are propagated respectively in registers 9 and 10 at the frequency of the clock signal $F_C$ delivered by generator 1. The accumulator circuit which is shown has a capacity of $2^{23}$. It is formed under these conditions by 23 adder circuits 7 connected in cascade. The carry over from each circuit is applied to the overflow input of the next circuit. Consequently, 23 clock cycles are required at frequency $F_C$ for obtaining at the overflow output C the uncorrected pulse of the synthesized clock signal $F_{Sj}$, each new accumulation starting at each period of the clock signal of frequency $F_C$.

The bits $b'_o$ to $b'_{22}$ forming the contents of the accumulator useful for the phase corrections do not leave the adders 9 simultaneously but are all shifted. $b'_{22}$ is in phase with the carry over $F_{Sj}$ when leaving the high weight accumulator. $b'_{21}$ is in advance by $1/F_C$ and so on, $b'_i$ is in advance by $(22-i)/F$ with respect to $F_{sj}$.

For obtaining a correct correction all these bits must be put back in phase and caused to coincide with $F_{sj}$ so as to supply the converter with stable and coherent bits $b_i$. Each bit $b'_i$ must be delayed by $(22-i)/F_c$ or 22-i clock pulses $F_c$. This is provided by means of a one bit register matrix, 11 to 20. Each bit $b_i$ passes through (22-i) registers or in the present case a matrix of $(22\times21)/2=231$ registers identical to circuit 9 or 10. The bits $b_i$ obtained are then sampled by the pulse $F_{Sj}$ by means of 22 registers 15 to 21 identical to registers 9 and 10. The 23 bit word forms the phase error on the corresponding pulse $F_{Sj}$, this word is stable until the next pulse and allows the converter to be controlled. One of the advantages of this accumulator is its very simple and regular structure allowing ready integration and optimum use of the speed of a given technology.

The typical elementary adder 8 may be made more rapid by providing two switched half adders. In fact, for a given phase increment the input $a_i$ of the adder does not change. Only the carry over and the input $b'_i$ vary.

Furthermore, in MOS technology, it is possible to use dynamic circuits because of the permanent and high speed clock $F_c$. For example, registers may be provided of the charge transfer type providing high integration density.

Figure 3:
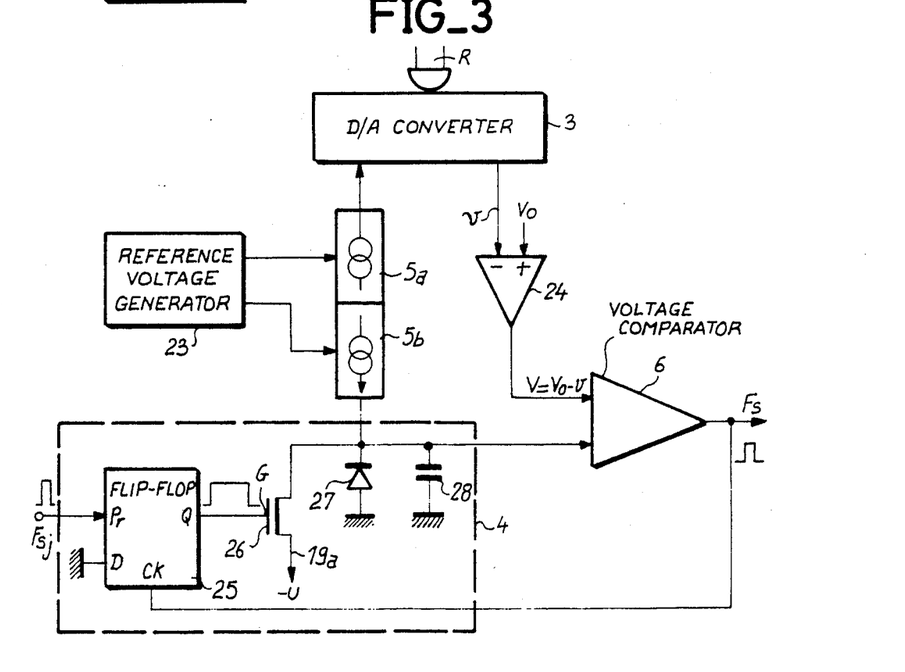
FIG. 3: the details of construction of the analog circuits for the time deviation aperiodic and linear correction of the invention.

The correction bits $b_o$ to $b_{22}$ read from registers 15 to 22 are applied to the input of the D-A converter 3 which is coupled to the ramp generator 4 and to the voltage comparator 6 as shown in FIG. 3. In this Figure a voltage reference generator 23 delivers reference voltages to two DC generators 5a and 5b which respectively apply a DC current for supplying the D-A converter 3 and the ramp generator 4, the details of construction of which are shown inside a broken line rectangle. A subtractor circuit 24, formed by an operational amplifier or any equivalent device, receives at a first operand input a constant reference voltage V0. This circuit is coupled by a second operand input to the output of the D-A converter 3. The subtractor circuit 24 delivers the voltage difference $V=V0-v$ between the reference voltage V0 and the voltage v delivered by the output of the D-A converter 3 which represents the phase error read out from registers 15 to 22. This voltage difference V is appied to a first comparison input of the voltage comparator 6. The ramp generator 4 is formed by a D flip flop 25 which is coupled by its set input to the overflow output C of the accumulator circuit 2 and is connected by its output Q to the gate of a field effect transistor 26 whose source is biased to a reference potential and whose drain is fed by the current source 5b. The drain electrode is further connected to the ground circuit of the ramp generator through a diode 27 and a capacitor 28 connected in parallel. This electrode is also connected to the second comparison input of the voltage comparator 6. The output of the voltage comparator 6 is relooped to the clock input of the D flip flop 25.

Figure 4:
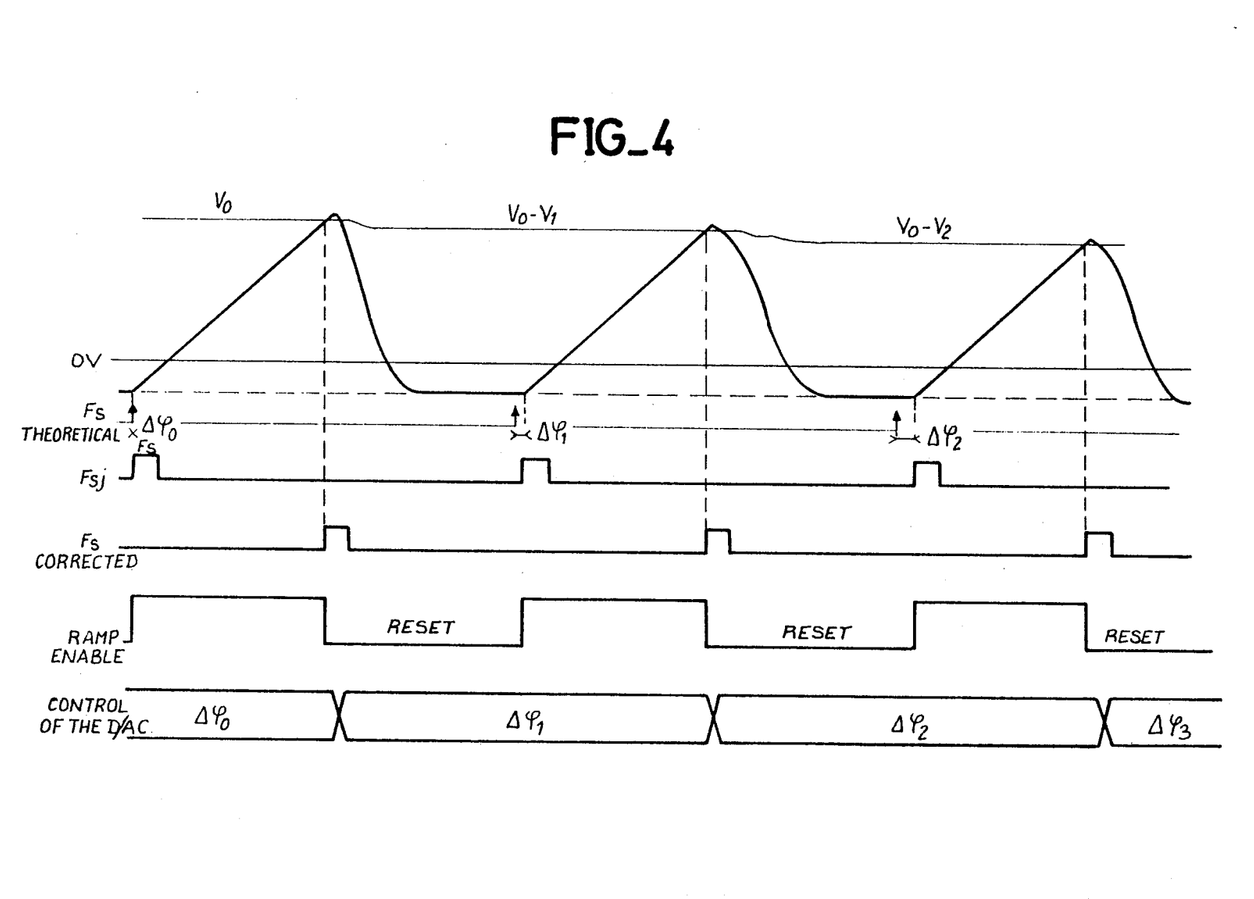
FIG. 4: a detail of the timing diagram and the forms of signals explaining the operation of the correction circuit of FIG. 3.

The operation of the clock signal synthesizer is as follows. Returning to FIG. 1, the basic principle applied by the invention consists in providing, by means of the accumulator circuit 2 formed of several elementary accumulators connected in cascade as shown in FIG. 2, the desired synthesis clock at the corrected frequency $F_S$ from the overflow carry bit appearing at the output C of the accumulator circuit 2. This bit is a pulse having as duration a clock period $F_C$ of the accumulator. The clock sinal $F_{Sj}$ delivered by the output C is phase modulated in accordance with a saw tooth and the amplitude of this modulation has a time deviation equal to $1/F_C$ which corresponds to a phase deviation of $(2\pi F'_S)/F_c$. This modulation is corrected by means of the analog correction circuit formed by the ramp generator 4, the D-A converter 3 and the voltage comparator 6. It consists in a first stage in determining the phase error between the signal of frequency $F_{Sj}$ and the frequency $F_S$ which it is desired to obtain. This phase error is found, in a way known per se, in the contents of the accumulator at the moment when the overflow pulse arrives of frequency $F_{Sj}$ delivered at the output C of the accumulator circuit 2. If we assume that the ratio of the frequencies $F_C/F_S$ is greater than $2^n$, the first $n-1$ bits corresponding to the most significant bits of the accumulator are always zero when the carry over arrives, this remark allowing them to be neglected and only the following k bits to be taken into account which represent the fraction of period $1/F_c$ in which the clock $F_{Sj}$ moves. This digital information is used by the device of the invention for shifting the pulse clock $F_{Sj}$ which is still phase delayed. For that, the k error bits are converted by the D-A converter 2 which delivers a voltage $V=VO-AR$ from the current reference $5a$ of the circuit shown in FIG. 3, R designating the useful remainder of the accumulator. During this time, the carry over signal $F_{Sj}$ is applied to the set input of the D flip flop of the ramp generator 4 referenced by the current source $5b$. Sitting of the D flip flop 25 controls disabling of the field effect transistor 26 and charging of the DC capacitor 28 by the current source $5b$ in the way shown in the diagram of FIG. 4. The ramp which appears at the terminals of capacitor 28 as well as the voltage V from the different circuit 24 are applied respectively to the first and second inputs of the voltage comparison circuit 6 which elaborates a pulse when the two voltages coincide. This pulse $F_S$ is of the same frequency as the frequency $F_{Sj}$ and is shifted forward depending on the value of R. Relooping of the output of the comparison circuit to the clock input of the D flip flop allows the appearance of pulses $F_S$, resetting of the D flip flop and enabling of the field effect transistor 26 for resetting the ramp generator by discharging the capacity 28 through the transistor 26. The system which has just been described, consequently allows the shifts $\Delta\phi_o$, $\Delta\phi_1\Delta\phi_2$, etc... in FIG. 4 of the carry over pulse of accumulator 2 to be corrected while causing the D-A converter to operate only once per pulse, which allows D-A converters to be used which are twice slower than the methods of the prior art or else clocks to be synthesized which are twice faster.

The pulses thus delivered are freed of all the non harmonic parasite spectral lines and may be used directly as phase reference in a frequency synthesis loop or else have their harmonics filtered away, depending on the application contemplated, by shaping.

Thus, the present invention eliminates to a large extent the parasite spectral lines in accordance with the known formula $$S_{dBc} = -20 \log_{10}((F_c/F_s) - 6 \times K) \qquad (1)$$

where $S_{dBc}$ is the level of the highest non harmonic spectral rays below the spectral ray at the frequency $F_S$, the synthesized frequency; $F_c$ is the frequency of the basic clock of the accumulator K is the number of bits of the converter.

Taking as typical application an application requiring the synthesis of frequencies about $10 \times 2^{19}$ Hertz, namely 5.24287 megahertz below at the pitch of 10 hertz with a clock $F_c = 10 \times 2^{23}$ hertz = 83.88608 megahertz. In this application the accumulator is of 23 bits. The ratio $F_c/F_S$ is still greater than $2^4$ and consequently the three most significant bits are neglected for carrying out the corrections. Taking the next 12 bits for effecting the correction and a 12 bit converter, this converter will have to respond to $\pm\frac{1}{2}$ LSB, LSB designating the least significant bit in less than 190 nanoseconds, which is achieved currently with present technologies. In this example, the range of correction of the pulses is 11.9 nanoseconds, consequently, it is sufficient to have a good linearity lasting for this short period. About the above mentioned frequency the non harmonic spectral lines are of the order $-96$ dBc.

In addition, if the ramp has a steep slope, of the order of 100 volt microseconds and if the comparator is very fast, formed for example with ECL technology, of the type used for A-D converters known under the designation "flash converter", phase noise levels are obtained at the output of the order of $-139$ dBc/Hz. Another advantage of the circuit which has just been described is that the use of an identical current reference of the same direction for the ramp generator and the D-A converter provides a much better invariance of the adjustment of the corrections as a function of the climatic variations, which is fundamental considering the spectral line levels reached.

In the examples given the D-A converter 3 receives 12 bits which are the bits b8 to b19, in the case where the maximum frequency, with clock $F_c$ at $10 \times 2^{23}$ hertz, is closed to $10 \times 2^{19}$ by a lower value. This allows the residual parasite spectral lines to be limited to $-96$ dB/c.

However, the device which has just been described, does not confirm the relationship (1) when the deviation from the frequency close, at a lower value, to $F_c/2^n$ is too great, for which the above described synthesizer is designed, n being a positive integer.

To make the correction of the time shifts effective whatever the frequencies, the phase error delivered by the accumulator device (2) should be expressed as a duration, which may be written in accordance with the relationship:

$$\Delta\phi = (2\pi R)/\text{Mod} \qquad (2)$$

R representing the contents of the accumulator circuit 2 and Mod representing the Modulo of the accumulator, by the expression $$\Delta t = (R/\text{Mod}) \times (1/F_s) \qquad (3)$$

Figure 5:
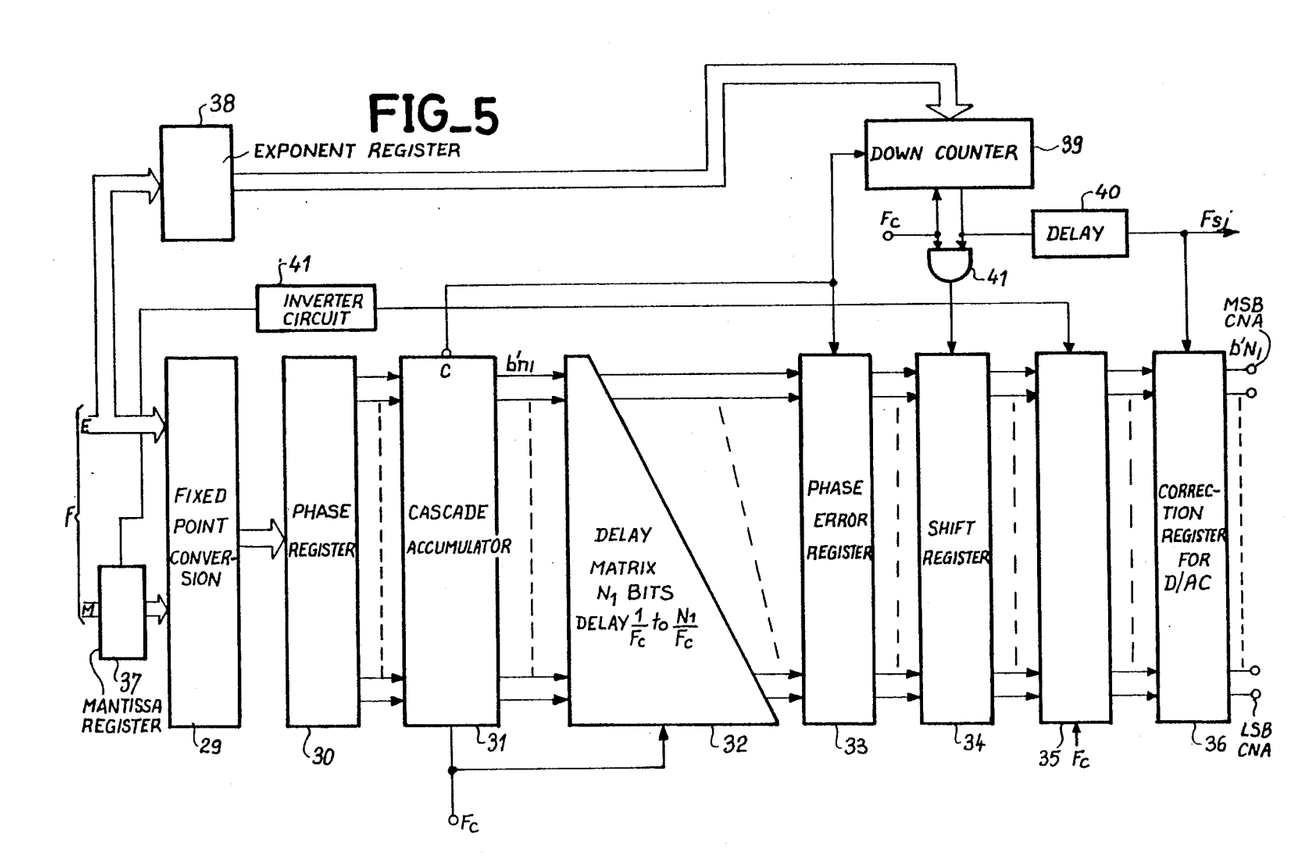
FIG. 5: a generalization of the circuit of FIG. 2 when the synthesis range is any whatsoever.

For that the accumulator circuit must be modified so as to form the computing device shown in FIG. 5. The accumulator circuit which is shown in FIG. 5 includes a fixed point converter 29, a phase register 30, an assembly 31 of accumulator circuits formed by the elements shown in FIG. 2, a delay matrix 32, a phase register 33, a shift register 34, a multiplier circuit 35 and a correction register 36, all these elements being connected together in this order in series. It also includes an exponent register 38, a decoder 39 and a delay circuit 40.

Circuit 34 provides the automatic shift, described above, of the bits to be supplied to the converter. The number of shifts to be provided is equal to the number of zero bits for the most significant bits of the phase increment, that is to say the whole part of log $F_c/2F_S$. To facilitate these operations, it is preferable to present the frequency to be synthesized in a binary floating format expressed as a fraction of the clock $F_C$. This frequency $F_S$ may be written in the form of a number F with floating point having a mantissa M and an exponent E which are applied to the input of the fixed point converter 29 so as to provide the phase increment in a fixed format over $N_1$ bits, the exponent E being stored in the exponent register 38. This phase increment of $N_1$ bits is then stored in the phase register 30 for feeding the accumulator circuit 31 whose structure is identical to that shown in FIG. 2. As in FIG. 2, the accumulator circuit 31 carries out these accumulation operations at the frequency $F_C$ and gives a result over $N_1$ bits. The $N_1$ bits leaving the accumulator circuit are introduced into the shift matrix 32 which is itself driven at the frequency $F_C$. The $N_1$ bits which leave the shift matrix 32 are sampled in register 33 by the overflow signal delivered by the output C of the accumulator circuit 31 which represents the frequency $F_{sj}$ of the uncorrected synthesized signal. The $N_1$ bits are then loaded into the shift register 34 which is a shift register of $N_1$ bits operating at frequency $F_C$. The shift register 34 is controlled by the output of the AND gate 41 which validates the signals from the clock generator 1 of frequency $F_C$ as a function of the contents of the downcounter 39. The contents of downcounter 39 is initialized at each pulse $F_{sj}$ by the value of the exponent which is stored in the exponent register 38 and this value is downcounted at the timing of frequency Fc. Consequently, the shift of the bits in the shift register 34 stops whenever the contents of the downcounter 39 is zero. The contents of the shift register 34 is then transferred to the correction register 36 of the D-A converter 3 through a multiplier circuit 35. This multiplier circuit 35 receives at a first operand input the bits delivered by the shift register 34 and at a second operand input the bits delivered by an operator whose function is to calculate the inverse of the mantissa M, 41 coupled to register 37. This is due to the fact that the correction which must be applied is a correction which is inversely proportional to the synthesized frequency and that the operation $R/F_S$ must be carried out for each useful residue.

It turns out that for each synthesized frequency $F_S$ corresponding to a number F, the residue R during a carry over, that is to say during a pulse $F_{sj}$ delivered by the output C of the accumulator circuit 31 is increased by $$R \leq F - 1$$

consequently ΔT is increased in accordance with the relationship:

$$\Delta t \leq (F-1)/\text{Mod} \times 1/F_S$$

since $(F/\text{Mod}) = (F_S/F_C,)$ the relationship: $\Delta t \leq 1/F \times (F-1)/F \leq 1/F_c$ is confirmed.

The phase jig is consequently increased by $1/F_c$ whatever the frequency to be synthesized and it is clear that the correction to be applied is inversely proportional to the synthesized frequency and that the operation R/F must consequently be carried out for each useful residue.

Figure 6:
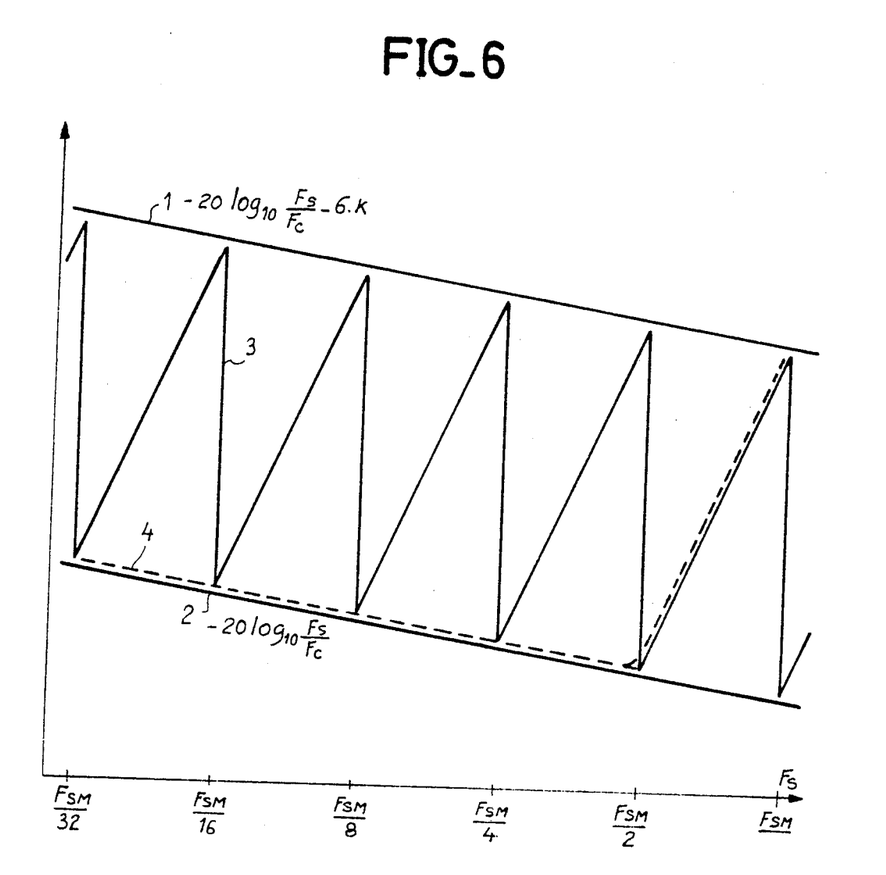
FIG. 6: a diagram illustrating the level of the residual spectral lines obtained over several octaves depending on whether the circuit used is the simple circuit of FIG. 2 or the more complex one of FIG. 5.

The representation shown in FIG. 6 of the levels of the residual spectral lines with correction and without correction allows the efficiency thereof to be checked. Without frequency correction with a correction adjustment corresponding to the maximum synthesized frequency it appears that the corrections are progressively degraded as shown by the curve at (4). With a correction within an octave, that is to say only correcting F with the exponent E of its floating representation, the equation (1) is only optimized once per octave and the curve of the level of the residual spectral lines is that which is shown at (3). With a correction within an octave, taking into account the mantissa M of the frequency increment, the corrections are optimized for all the frequencies and the equation (1) is achieved whose graphic representation corresponds to the curve (1) in FIG. 6. For that, it is sufficient to carry out the operation R'/M with as many bits for M as for R', R' being the transform of 4 by the register 34. Hereagain we have available for carrying out this operation, the interval between two characters, namely $1/F_S$ which is convenient for multiplication. Since the multiplier 35 introduces an additional delay in the computation and since this delay is constant, the frequency $F_{Sj}$ is delayed so as to ensure coincidence thereof with the bits $b'_i$ by the delay circuit 40.

To increase the performances of the multiplier 34 it will be possible also to choose for this circuit a systolic network or pipe line structure, the apparent speed will be greater although the delay of the circuit remains the same. Also in the embodiment shown in FIG. 5, the operator 40 could be provided simply by means of an ROM of relatively small capacity, that would represent 6 K bits for a mantissa of 12 bits.

What is claimed is:

1. A high frequency digital synthesizer with periodic corrections optimizing the spectral purity with high time precision, comprising:
    a generator of reference clock signals of frequency $F_C$,
    a computing device which, from a frequency increment of the signal to be synthesized, delvers on the one hand uncorrected pulses of frequency $F_{Sj}$ shifted in time with respect to the signal to be synthesized of frequency $F_S$ by an amount Δt at most equal to $1/F_C$ and, on the other hand, a time error signal corresponding to the shift Δt, and
    a correction circuit coupled to said computing device for delaying the signal $F_{Sj}$ by a maximum time when the timing error signal is zero and by an amount equal to the maximum time reduced by the shift Δt indicated by the timing error signal,
    said computing device comprising at least an accumulator register, incremented at a constant steps at the reference frequency $F_c$ of the clock signal generator having an overflow output for delivering uncorrected pulses of frequency $F_{Sj}$ whenever the maximum capacity of the accumulator register is reached and having an output D for delivering the contents of said accumulator register to said correction circuit and initializing said correction circuit, after each overflow of the maximum capacity of the accumulator register, by the content of said accumulator registor which represent at this time said time error signal.

2. The synthesizer as claimed in claim 1, wherein the increment is applied digitally to the computing device with floating point in the form of a mantissa and an exponent, the increment being transmitted to the accumulator register through a fixed point converter, a phase register and the contents of the accumulator register being transmitted to the correction circuit through a delay matrix, a shift register, a multiplier circuit and a correction register, the whole of these elements being connected together in this order in series.

3. The synthesizer as claimed in claim 2, wherein said multiplier circuit effects the multiplication of the contents of the shift register, the inverse of the multiplication of the contents of the shift register and the inverse of the mantissa of the increment applied to the input of the computing device.

4. The synthesizer as claimed in claim 3, wherein said correction circuit includes:
- a D-A converter coupled to the computing device for converting the time error into analog form,
- a ramp generator initiated by the uncorrected frequency signal obtained at the overflow output of the accumulator register, and
- a voltage comparator circuit coupled by a first input to the output of the ramp generator and by a second input to the output of the D-A converter through a circuit computing the difference between a given reference voltage and the voltage delivered by the output the D-A converter representing the time error, the ramp generator being reset by the output of the comparator circuit when a voltage equality is detected by the comparator circuit between the output level of the ramp generator and the output level of the difference computing circuit.

5. The synthesizer as claimed in any one of claims 2 to 4, wherein said accumulator register is formed of elementary 1 bit accumulators connected in cascade in a systolic network or pipe line structure.

6. The synthesizer as claimed in claim 5, wherein said multiplier circuit has a systolic network structure.

7. A high frequency digital synthesizer with aperiodic correction optimizing the spectral purity, including:
- a generator of reference clock signals of frequency $F_C$,
- an accumulator register incremented at constant steps at the reference frequency $F_C$ of the clock signal generator having an overflow output for delivering a first clock signal, whenever the accumulator registor reaches its maximum capacity and having an output D for reading the contents of said accumulator register,
- a D-A converter coupled to output D of the accumulator register for converting the content of said accumulator register in a first voltage signal,
- a ramp generator initiated by by said first clock signal for delivering a second voltage signal having the form of a ramp,
- and a voltage comparator circuit coupled by a first input to the output of a ramp generator and by a second input to the output of the D-A converter through circuit computing the difference between a predetermined reference voltage and the first voltage signal delivered by the output of the D-A converter the ramp generator being reset by the output of the comparator circuit when voltage equality is detected by the comparator circuit between the output voltage level of the ramp generator and the output voltage level of the difference computing circuit.

* * * * *